US009095067B2

(12) United States Patent  
Chen (10) Patent No.: US 9,095,067 B2  
(45) Date of Patent: Jul. 28, 2015

(54) APPARATUS AND METHOD FOR VERTICALLY-STRUCTURED PASSIVE COMPONENTS

(71) Applicant: Wintec Industries, Inc., Milpitas, CA (US)

(72) Inventor: Kong-Chen Chen, San Jose, CA (US)

(73) Assignee: Wintec Industries, Inc., Milpitas, CA (US)

( * ) Notice: Subject to any disclaimer, the term of this patent is extended or adjusted under 35 U.S.C. 154(b) by 46 days.

(21) Appl. No.: 14/069,054

(22) Filed: Oct. 31, 2013

(65) Prior Publication Data

US 2014/0055968 A1    Feb. 27, 2014

Related U.S. Application Data

(63) Continuation of application No. 12/631,649, filed on Dec. 4, 2009, now Pat. No. 8,593,825.

(60) Provisional application No. 61/251,617, filed on Oct. 14, 2009.

(51) Int. Cl.
*H05K 1/11* (2006.01)
*H05K 3/30* (2006.01)
(Continued)

(52) U.S. Cl.
CPC ............... *H05K 1/111* (2013.01); *H01L 23/64* (2013.01); *H05K 1/0231* (2013.01); *H05K 1/0233* (2013.01); *H05K 1/0234* (2013.01); *H05K 1/181* (2013.01); *H05K 3/301* (2013.01); *H05K 3/341* (2013.01); *H01L 2224/04105* (2013.01); *H01L 2224/20* (2013.01); *H01L 2924/19103* (2013.01); *H05K 2201/086* (2013.01); *H05K 2201/1053* (2013.01); *H05K 2201/10515* (2013.01);

(Continued)

(58) Field of Classification Search
CPC ............ H01L 2924/00; H01L 2224/48227; H01L 2224/32225; H01L 2224/73265; H01L 2924/00014; H01L 2224/48091; H01L 2224/97; H01L 2924/15311; H01L 2924/00012; H01L 2224/48465; H01L 2224/16225; H01L 2224/8121; H01L 2224/81801; H01L 2224/83051; H01L 2224/83194; H01L 2224/83385; H01L 2224/838; H01L 2224/83801; H01L 2224/83855; H01L 2224/85011; H01L 2224/85051; H01L 2224/85201
USPC ............... 361/767, 765; 257/296, 718, 789; 338/320, 309; 333/1.1, 24.2
See application file for complete search history.

(56) References Cited

U.S. PATENT DOCUMENTS

| 6,040,983 | A | * | 3/2000 | Baudouin et al. | ............. | 361/760 |
| 6,108,212 | A | * | 8/2000 | Lach et al. | ............. | 361/768 |
| 2008/0174979 | A1 | * | 7/2008 | Furihata et al. | ............. | 361/807 |

*Primary Examiner* — Timothy Thompson
*Assistant Examiner* — Ahmad D Barnes
(74) *Attorney, Agent, or Firm* — Kilpatrick Townsend and Stockton LLP (57) ABSTRACT

An electronic device is presented for electrical connection between a first pad contact of an integrated circuit component and a target contact positioned substantially in a first plane of a target platform. The electronic device includes a first surface substantially parallel to the first plane and a second surface below the first surface substantially parallel to the first plane. The first surface includes a first contact region configured to connect to the first pad contact when the electronic device is connected between the first pad contact and the target contact. The second surface includes a second contact region configured to connect to the target contact when the electronic device is connected between the first pad contact and the target contact. The electronic device further includes a multitude of electrically passive elements connected between the first and second contact regions.

44 Claims, 9 Drawing Sheets

(51) Int. Cl.
 *H01L 23/64* (2006.01)
 *H05K 1/02* (2006.01)
 *H05K 1/18* (2006.01)
 *H05K 3/34* (2006.01)

(52) U.S. Cl.
 CPC ............ *H05K2201/10636* (2013.01); *H05K 2201/10643* (2013.01); *H05K 2201/10674* (2013.01); *H05K 2201/10719* (2013.01); *Y10T 29/4902* (2015.01); *Y10T 29/4913* (2015.01); *Y10T 29/49144* (2015.01)

Pin 2 Pad Contact

800

Out 2 Target Contact

Pin 2 Pad Contact

850

Out 2 Target Contact

Figure 8

Figure 9

APPARATUS AND METHOD FOR VERTICALLY-STRUCTURED PASSIVE COMPONENTS

CROSS-REFERENCES TO RELATED APPLICATIONS

This application is a continuation of commonly assigned U.S. patent application Ser. No. 12/631,649, filed on Dec. 4, 2009, titled "Apparatus and Method for Vertically-Structured Passive Components," which claims priority, under 35 U.S.C. §119(e), from U.S. Provisional Application No. 61/251,617, filed on Oct. 14, 2009, entitled "Apparatus And Method of Vertical Passive Components," the contents of all of which are incorporated herein by reference in their entirety.

BACKGROUND

1. Field of the Invention

This invention relates generally to the manufacture of electronic components, and more particularly to using a structure which is substantially perpendicular to a first plane of a target platform to implement passive electronic components.

2. Related Art

Semiconductor components are often manufactured using a ball grid array ("BGA") package, where metallic solder balls composing tin, silver and copper, are pre-soldered at pad contacts of a component package for soldering the semiconductor component to a target platform, such as a printed circuit board ("PCB"). Semiconductor components are also often manufactured in a leadless grid array ("LGA") package where there are no solder balls at the pad contacts of the package. Instead, a thin layer of solder paste is printed on the metal contacts of a PCB during product assembly to solder the semiconductor component on the PCB.

Other packages are also used in semiconductor component manufacturing. For example, a quad flat-pack package ("QFP") or a small outline integrated circuits package ("SOIC") uses gull-wing shaped metal leads attached to the periphery of the package to couple the packaged semiconductor component to a PCB. As another example, a dual-in-line package ("DIP") or a pin grid array package ("PGA") sticks metal pins at the periphery of the package or at the bottom surface of the package for inserting the packaged part into a socket or for soldering it into a set of through-holes on a target platform, such as a PCB. Additionally, a ceramic-leaded chip carrier ("CLCC") package or a plastic-leaded chip carrier ("PLCC") package affixes J-shaped metal leads to the periphery of a packaged semiconductor component for connecting the semiconductor component to a target platform, such as a PCB.

One thing common to many conventional packages for semiconductor component is that nothing more than metal contacts, metal pins, or solder balls are attached to pad contacts of the packages to connect the semiconductor component to a target platform.

When using a semiconductor component, such as an integrated circuit ("IC"), passive components, also referred to as "passives," such as resistors, capacitors or inductors, are often added to make the semiconductor component function properly. For example, decoupling capacitors are often connected to the power pins of an IC component to filter out power noises. A current limiting resistor is often coupled to a driver pin of an IC component to limit driver output current. Or, a termination resistor is often coupled to a signal path to suppress reflection in the high speed trace. Conventionally, these passives are often placed near the pins of the IC component to which the passive is coupled in order to maximize their effectiveness. However, these passives are placed beyond the IC package outline, which often occupy substantial area on the target platform and also compete with interconnect layout routing around the IC component, especially if the IC package has high pin-count.

Figure 1:
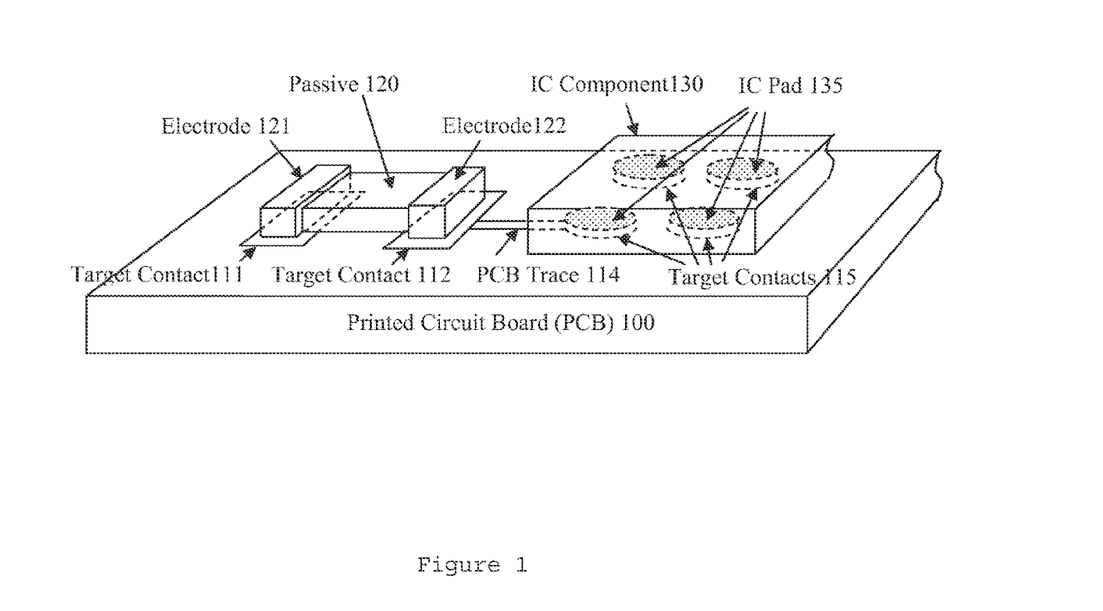
FIG. 1 is an illustration of a conventional printed circuit board assembly.

FIG. 1 illustrates a simplified version of a conventional printed circuit board ("PCB") assembly, where a conventional, horizontally structured passive component 120 and an IC component 130 are soldered to a PCB 100. The IC component 130 includes a set of IC pads 135 which are soldered to a set of target contacts 115 on PCB 100. Solder balls connect the IC pad 135 and the target contact 115 on the PCB. To connect a passive component 120 to a pad of IC component 130 on the PCB 100, two target contacts 111 and 112 are added to the surface of PCB 100, where the electrodes 121, 122 of the passive component 120 are connected to the target contacts 111, 112. To connect the electrode 122 of the passive component 120 to an IC pad 135 in the IC component 130, an additional PCB trace 114 is added to the surface of PCB 100, which connects target contact 112 to a corresponding target contact 115 in IC component 130. In the example depicted by FIG. 1, the passive component 120 occupies PCB area, and may also block signal traces around the IC component 130 on the PCB 100.

There is an additional potential problem in using the conventional passive components. For mobile or high density electronic products, there is a continuous trend to miniaturize the package size, including the supporting passives. For example, the common size of passive components used in a high density DRAM module design has been changed from a 0603 package having a dimension of 60 mils in length and 30 mils in width to a smaller 0402 package having a dimension of 40 mils long by 20 mils wide. In mobile devices, such as cellular phone, a 0201 package of 20 mils long by 10 mils wide which further reduces the size of area occupied by the passive components becomes more widely used. The current state-of-the-art for passive component is a 1005 package having a dimension of 10 mils in length and 5 mils in width. This reduced passive size makes it difficult to solder conventional passive components to a target platform, such as a PCB, because of the increased likelihood of insufficient soldering or solder bridging problems. Much of the difficulties in soldering smaller passives to a target platform originate from the horizontal structure in which most passives are fabricated, with an electrode at each end of the horizontal structure. A solution that can reduce the target platform area overhead used by the passive component and while reducing the bridging and/or insufficient soldering problem encountered by the ultra-small passives during PCB assembly is useful.

SUMMARY

The present invention comprises an electronic device which implements an electrically passive component in a vertical configuration. More specifically, the electronic device is coupled to a target platform that is positioned substantially in a first plane. The electronic device comprises a first surface that is substantially parallel to the first plane and includes a first contact region. The electronic device also comprises a second surface substantially parallel to the first plane and including a second contact region. A structure, which is substantially perpendicular to the first plane, electrically connects the first contact region and the second contact region to implement one or more passive functions. An insulation sidewall is adjacent and external to the structure. In an embodiment, the insulation sidewall surrounds at least one of the first contact region or the second contact region. For example, the structure connects the first contact region and the second contact region to implement a resistor, a capacitor, an inductor, a conductive path, a diode device or a conductive path. As another example, the structure connects the first contact region and the second contact region to implement combinations of passive components, such as a resistor coupled to a capacitor, a resistor coupled to a conductive path, or other combinations of electrically passive components.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The Figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

A preferred embodiment of the present invention is now described with reference to the Figures where like reference numbers indicate identical or functionally similar elements. Also in the Figures, the left most digits of each reference number correspond to the Figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" or "an embodiment" in various places in the specification are not necessarily all referring to the same embodiment.

Additionally, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the claims.

Figure 2:
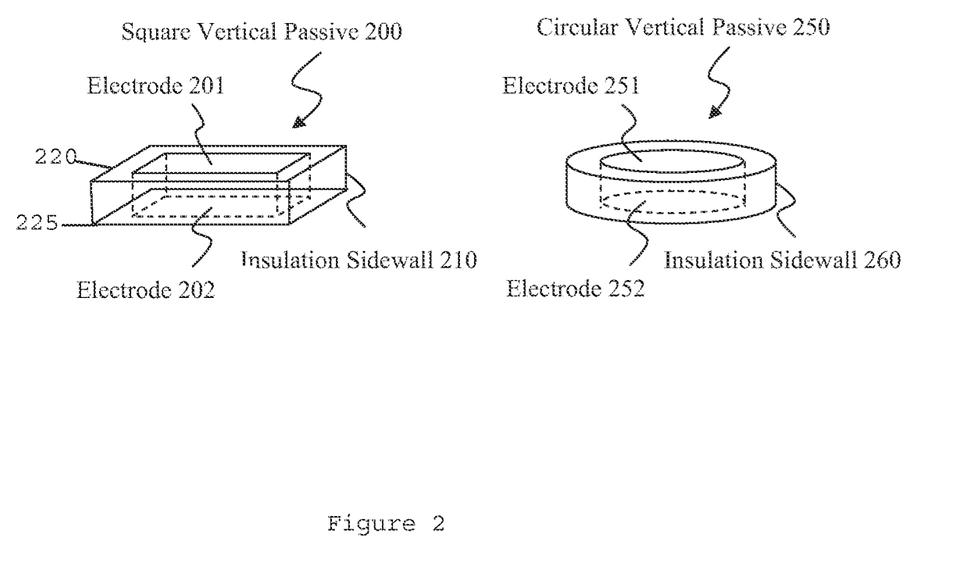
FIG. 2 is an illustration of example vertically-structured passive components according to an embodiment of the present invention.

One embodiment of the invention configures the passive components in a vertical structure with terminal electrodes fabricated at the top and the bottom surfaces of the vertical structure and with an insulation sidewall external to and adjacent to the structure and proximate to one or more of the electrodes, as shown in FIG. 2. As used herein, the term "vertical" is used to describe any orientation that is substantially perpendicular to a target plane. For example, an orientation where the structure of a passive component is substantially perpendicular to a plane of a target platform, such as a printed circuit board (PCB). In one embodiment, a vertically structured passive component, or "vertical passive," comprises a first surface 220 and a second surface 225 parallel to the first surface and below the first surface. The first surface 220 includes a first contact region, such as a first electrode 201, and the second surface includes a second contact region, such as a second electrode 202. The vertical structure 200, 250 electrically connects the first contact region, such as electrode 201, 251, and the second contact region, such as electrode 202, 252 to implement one or more passive components. For example, the vertical structure 200, 250 connects the first contact region and the second contact region to implement a resistor, a capacitor, an inductor, a conductive path, a diode device or a conductive path. As another example, the vertical structure 200, 250 connects the first contact region and the second contact region to implement a combination of passive components, such as a resistor coupled to a capacitor, a resistor coupled to a conductive path or other combinations of passive components.

FIG. 2 shows two examples of vertical passives, where one example vertical passive comprises a square vertical structure 200 which includes square contact regions, such as square electrodes 201, 202, and a square insulation sidewall 210 surrounding the square vertical structure 200. Another example vertical passive component is the circular vertical structure 250, also shown in FIG. 2. The circular vertical structure 250 includes circular contact regions, such as electrodes 251, 252, and a circular insulation sidewall 260 around the circular vertical structure 250. However, the vertical passive components shown in FIG. 2 are merely examples, and in other embodiments, vertical passives are implemented using vertical structures having other geometries, such as rectangular, rhomboidal, hexagonal, octagonal, half-circular or other irregular shapes. Additionally, in other embodiments, vertical passives are implemented using any combinations of these geometries, such as vertical passive having a square insulation sidewall and a circular contact region, such as a circular electrode. As shown in FIG. 2, the vertical passive may have a first axis that is substantially perpendicular to the plane of the target platform and a second axis that is substantially parallel to the plane of the target platform. The examples in FIG. 2 are merely for illustration and are not an exhaustive list of possible implementations.

In an embodiment, a vertical passive is sized to be compatible with a pad size and pin pitch associated with an integrated circuit ("IC") component. The horizontal dimension of the vertical passive, such as the diagonal across a square vertical structure or the diameter of a circular vertical structure, may be on the order of millimeters or smaller. The height of the vertical passive is also in the millimeter range or smaller. Additionally, in an embodiment, the area of the contact regions of a vertical passive is large enough to provide a good contact with the pad of IC component in a soldered connection or to facilitate a good contact with the IC component in a solderless assembly.

A vertical passive may include an insulation sidewall as a protection layer, in one embodiment. The insulation sidewall may be adjacent to the vertical passive and external to the vertical passive. The insulation sidewall prevents solder bridging between electrodes and/or prevents an electrical short between an IC pad and a PCB target contact because of their narrow proximity when a thin vertical passive is placed in between.

The vertical structure may be used to implement many types of passive components, such as a resistor, a capacitor, an inductor, a ferrite bead or other passive components. In an embodiment, the vertical structure includes a plurality of passive components in a combination structure. The vertical structure also applies to semiconductor devices, such as a Zener diode, an ESD protection diode, a light emitting diode ("LED"), other diode devices or other semiconductor devices. In another embodiment, the vertical structure comprises a pure insulator or conductor for use as a mechanical support, a capacitor or an interconnection.

Figure 3:
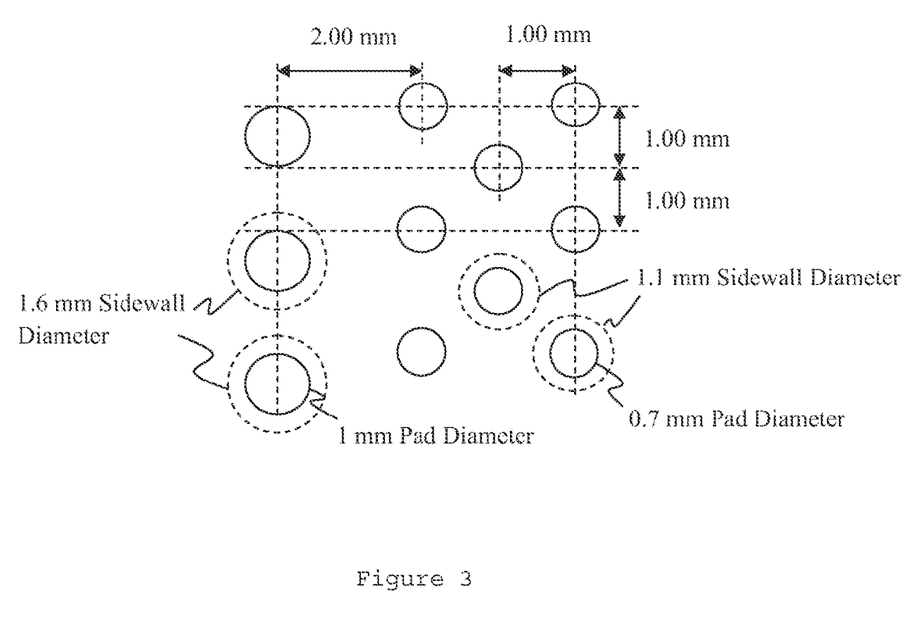
FIG. 3 is a comparison of the dimensions of a leadless grid array-52 ("LGA-52") package to the horizontal dimension of a virtually-structured passive component according to an embodiment of the present invention.

FIG. 3 is an example showing compatibility of a vertical passive with respect to the pad size and pin pitch of an integrated circuit ("IC") component and suitability of the vertical passive for connecting to an IC component. FIG. 3 is an excerpt of the pad configuration of a leadless grid array-52 ("LGA-52") package, which includes circular shaped pads of two different pad sizes. The first pad size is 1.0 mm in diameter, as shown in the leftmost column of FIG. 3. The second pad size is smaller, 0.7 mm in diameter, as shown in the right three columns of FIG. 3. The pad sizes are approximately half of the center distance between two nearest pads. In the LGA-52 package, the shortest center distance is 1.414 mm for the smaller pads and is 2.00 mm for the larger pads.

In an embodiment, to connect, or place, a vertical passive at a pad of the LGA-52 package shown in FIG. 3, two vertical passives are fabricated. A first vertical passive has a contact area diameter of 0.7 mm and a second vertical passive has a contact area diameter of 1.0 mm, matching the two pad sizes in LGA-52 package, respectively. In an embodiment where soldering is used to connect a vertical passive to a package pad contact, it is beneficial to surround the contact areas of a vertical passive with a protective insulation sidewall.

For example, if the diameters of two vertical passives, including the insulation sidewall used in an LGA-52 package, are chosen at 1.1 mm and 1.6 mm respectively, which is approximately 80% of the shortest center distance between two nearby pads at 1.414 mm and 2.0 mm, respectively, then the insulation sidewalls would have thicknesses of 0.2 mm [i.e. (1.1 mm−0.7 mm) divided by 2] and 0.3 mm [i.e. (1.6 mm−1.0 mm) divided by 2], respectively. In different embodiments, the insulation sidewall may be thicker or thinner than these values, as long as the dimension of insulation sidewall is sufficient to prevent solder bridging between the top and bottom electrodes at a vertical passive or to prevent shorting between pad contact on a LGA-52 package and target contact on PCB when a vertical passive is placed between them. Typically, the height of a vertical passive is smaller than the dimension of a horizontal cross section of the vertical passive.

It can be seen that a vertical passive with a 0.7 mm contact area diameter and a 1.1 mm sidewall diameter has a larger contact area but a smaller component footprint than a conventional horizontally-structured passive in a 0603 package. The contact area of an electrode of a horizontally-structured passive in a 0603 package is about 0.25 mm×0.75 mm, or approximately 0.19 mm². However, the contact area of a vertical passive having a contact area diameter of 0.7 mm is $\pi \times (0.35 \text{ mm})^2$ or approximately 0.38 mm², which is twice the electrode contact area of a horizontally-structured passive in a 0603 package. The increased contact area of the vertical passive allows better connection between the vertical passive and the target platform with improved electrical characteristics. For example, the larger contact area of the vertical passive enables a better solder connection between the vertical passive and the target platform. The physical dimension of vertical passive is also rather compact. The physical footprint of a vertical passive with a 1.1 mm in outer diameter, including the protective insulation sidewall, can be calculated as $\pi \times (0.55 \text{ mm})^2$ or 0.95 mm², which is slightly smaller than the horizontal cross-sectional area of a horizontally-structured passive in a 0603 package, which is approximately 1.125 mm² (60 mils×30 mils or 1.5 mm×0.75 mm).

Figure 4:
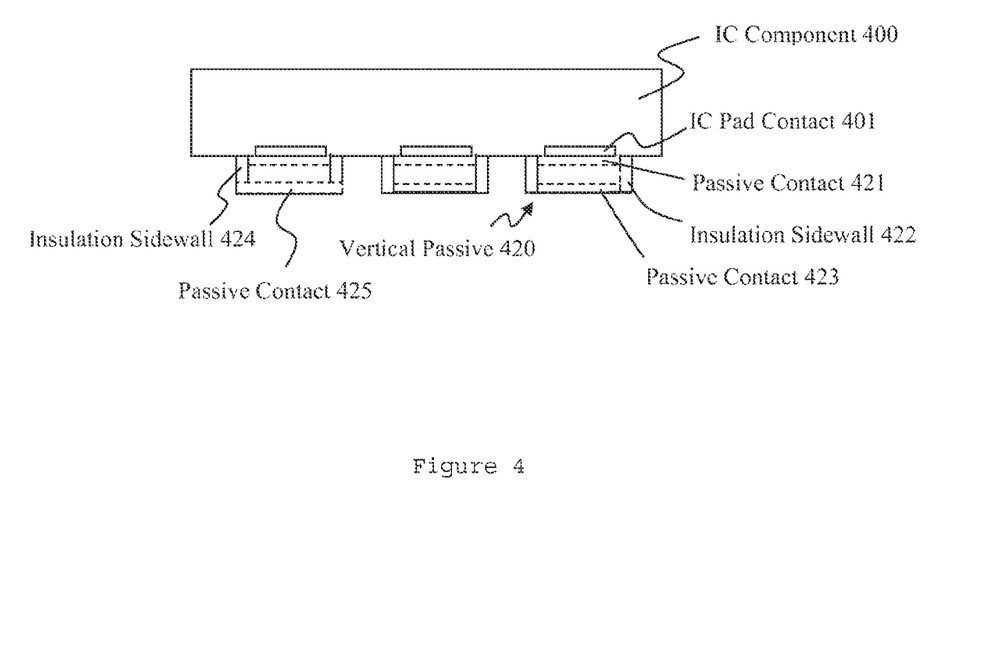
FIG. 4 is a side-view of an example set of vertically-structured passive components coupled to pad contacts of an integrated circuit component according to embodiments of the present invention.

In different embodiments, the vertical passives are surface mounted or bonded to the pad contact of an IC component. FIG. 4 shows a side view of an example set of vertical passives mounted to an example integrated circuit ("IC") component. The vertical passive 420 with passive contact 421, for instance, is soldered to an IC pad contact 401 of IC component 400. The insulation sidewall 422 surrounding the vertical passive 420 has a dimension larger than the IC pad contact 401 to prevent potential solder bridging among the passive contact 423, the passive contact 421 and the IC pad contact 401 during soldering or bonding. In one embodiment, the insulation sidewall is fabricated to protect both passive contacts areas 421, 423, as shown by the insulation sidewall 422. Alternatively, the insulation sidewall protects a single passive contact region, as illustrated by the insulation sidewall 424. When the insulation sidewall 424 protects a single passive contact region, the unprotected passive contact region 425 has a larger area for use as an electrode by an external connection. In an embodiment, an IC component soldered with vertical passives at its pad contacts is coupled to a printed circuit board (PCB), or other target platform, using a soldered mounting method, a solderless mounting method or any other suitable connection method, where the passive contact region 423 electronically contacts a target contact on the target platform.

In an alternative embodiment, the vertical passive 420 is coupled to a metal pin attached to the periphery of the IC component or to the bottom surface of the IC component, such as in a pin grid array package ("PGA") or similar configuration. These metal pins are for inserting into through holes or into a socket on a target platform, such as a printed circuit board ("PCB"). This allows the vertical passive 420 to be coupled to the IC component via the metal pin while remaining detached from the target platform.

As shown in FIG. 4, the vertical passive 420 attached to the IC component 400 is constructed so that the passive contact 421 is substantially parallel to a plane including the surface of the IC component 400. The passive contact 423 is also substantially parallel to the plane including the surface of the IC component 400. Hence, the passive contact 421 and the passive contact 423 are substantially parallel to the plane including the surface of the IC component. A structure is coupled to the passive contact 421 and the passive contact 423, electrically connecting or coupling the passive contact 421 and the passive contact 423 to allow the vertical passive 420 to implement one or more passive functions. The structure is substantially perpendicular to the plane including the surface of the IC component. By orienting the structure connecting the passive contact 421 and the passive contact 423 substantially perpendicular to the plane including the surface of the IC component 400, one or more passive components may be attached perpendicular to the pad of the IC component, conserving space on the target platform when the IC component 400 is assembled on the target platform.

As an alternative to pre-coupling vertical passives to the pad contacts of an IC component or device for subsequent assembly of the IC component or device on a target platform, a vertical passive may be pre-coupled to a target platform. For example, the vertical passive is pre-soldered to the target platform. Then an IC component or device is coupled to a vertical passive which is coupled to the target platform. In this embodiment, the pad contacts of the passives soldered to the target platform are configured to have an area compatible with the pad contacts of the IC component. In various embodiments, the target platform comprises a PCB, a packaged IC component, a bare die, a stacked die, a packaged device, a sensor, an electro-optical device, an electro-mechanical device, a flex or any other suitable platform. In an embodiment, vertical passives are be cascaded vertically, where resistor, capacitor, and/or inductor, are butted at the passive contact pads on top of each other.

Figure 5:
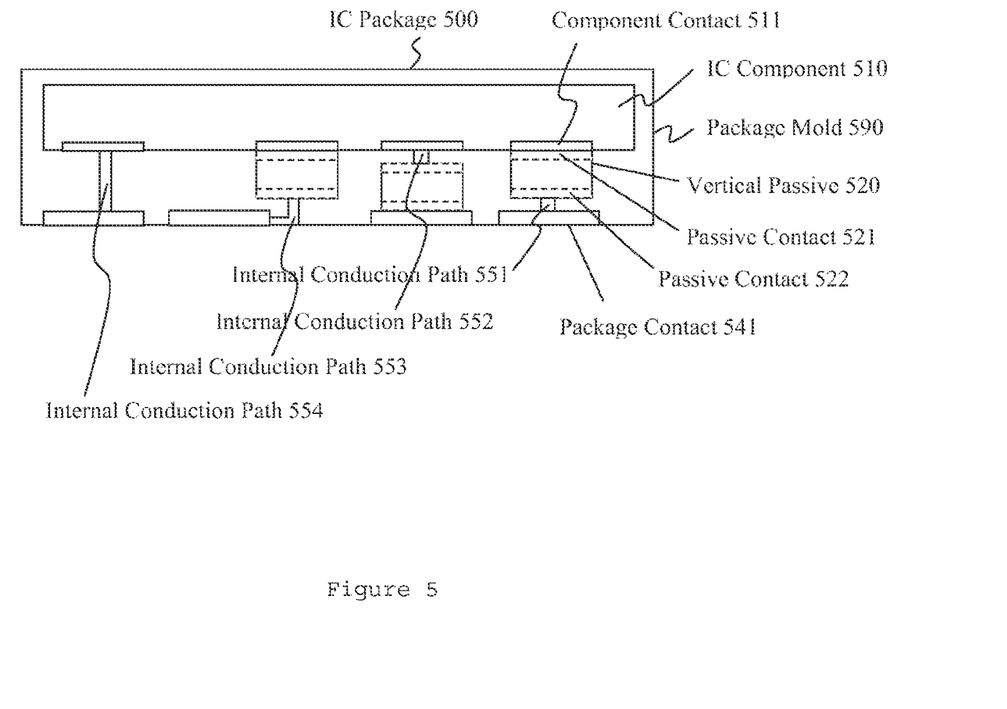
FIG. 5 is a cross-sectional view of vertically-structured passive components embedded within an integrated circuit component package according to an embodiment of the present invention.

As another alternative embodiment, the vertical passive is embedded in a package. FIG. 5 illustrates an example integrated circuit ("IC") package with vertical passives embedded in the package. The embedded vertical passives may be directly attached to a pad contact at the package, directly attached to the pad contact at internal IC component or attached to a pad contact in between the package and the internal IC component.

In FIG. 5, a passive contact 521 of the vertical passive 520, for instance, is attached to a component contact 511 of an IC component 510 included in an IC package 500. The passive contact 522 at the opposite end of the vertical passive 520 is connected to a package contact 541 through an internal conduction path 551. The IC component 510 may be an integrated circuit die.

Within an IC package, variations in alignment between component contacts, passive contacts, or package contacts in an IC package are allowed. Internal conduction paths can be used to connect the package contacts, the passive contacts, or the component contacts in the IC package, as illustrated by the package internal conduction paths 551,552, and 553. Hence, the embedded vertical passives can be placed at locations that meet the IC package fabrication needs. In some cases, there could be no embedded passive between the component contact and the package contact, as the package internal conduction path 554 shown.

The package mold 590, functions similarly to the protective insulation sidewall of a discrete vertical passive. In an embodiment, the package mold 590 encapsulates the IC component and the embedded vertical passives while leaving the package contact openings exposed.

In an embodiment, the IC package with embedded vertical passives uses explicit metal pins, as in the case of DIP or PGA package, to replace flat contact pads, as in the case of the ball grid array package ("BGA"). Alternatively, the contact pads of the IC package with embedded passives are implemented using explicit gull-wing-shaped or J-shaped metal leads as in the case of quad flat-pack ("QFP"), small outline integrated circuits ("SOIC"), plastic-leaded chip carrier ("PLCC"), or ceramic-leaded chip carrier ("CLCC") packages. For solderless assembly, conductive elastomer may be attached to contact pads of IC package. Similarly, the component or device in a package including embedded vertical passives may be an integrated circuit, a bare die, a stacked die, a packaged device, a stacked device, a sensor, a diode, or an electro-mechanical element.

In one embodiment, to couple the vertical passive components to a PCB, a thin layer of solder of a few thousandths of an inch ("mils") is pre-coated at the surface of electrodes at the vertical passives, which may replace and obviate the solder paste printing step used in traditional surface mount assembly. Pre-coating the electrode surfaces with a thin layer of solder may also prevent removal of residual solder paste remaining on a stencil after printing, reducing environmental contaminations.

There are other advantages in using the vertical passives. Because vertical passives are sandwiched, or embedded, between an integrated circuit ("IC") component and a PCB after assembly, the performance of passive components is improved, such as providing capacitive charges in situ at the power pin to meet the IC transient switching need. Use of vertical passives also removes explicit traces that connect passive components to an IC component on a PCB or other target platform, reducing spurious noise. Additionally, the PCB or substrate area overhead used by traditional passives is substantially reduced by vertical passives, enabling manufacture of a more compact electronic product.

In an embodiment, a vertical passive includes a combination structure of two or more passive components. For example, a vertical passive includes a combination structure such as a resistor and a capacitor, a resistor and a conduction path, a capacitor and a conduction path, an inductor and a conduction path, a ferrite bead and a conduction path, a diode and a conduction path, an electro-optical device and a conduction path, a resistor and a capacitor and a conduction path or other combination of passive components. In one configuration, a vertical passive including a combination structure has more than two contact regions, such as more than two electrodes. The combination structure of passive elements may be implemented by vertically cascading passives or vertically combining passives in parallel. Vertical passives including a combination structure may be directly coupled to the pad contacts of a package or directly embedded in a package to improve effectiveness of the combination structure of passive components and to minimize the physical area occupied by passive components.

Figure 6:
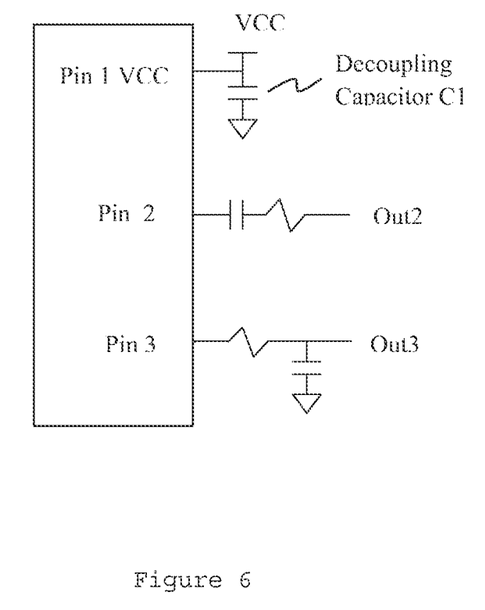
FIG. 6 illustrates examples connection of passive components to a semiconductor integrated circuit component.

FIG. 6 illustrates example connections of passive components, such as a capacitor, or a combination of a capacitor and a resistor to an example integrated circuit (IC) component. In FIG. 6, capacitor C1 is a decoupling capacitor connected to a power input (VCC) of the IC component, indicated as pin 1 in FIG. 6. The pin 2 connection in FIG. 6 is a series connection of a resistor and a capacitor, which may be used in the feedback circuit of an active filter, PWM driver output, or high pass filter. The connection to pin 3, shown in FIG. 6, is a resistor and capacitor connected to implement a low pass filter. Implementations of vertical passives and combination structures including two or more passive elements provide additional details about use of the vertical structure.

Figure 7:
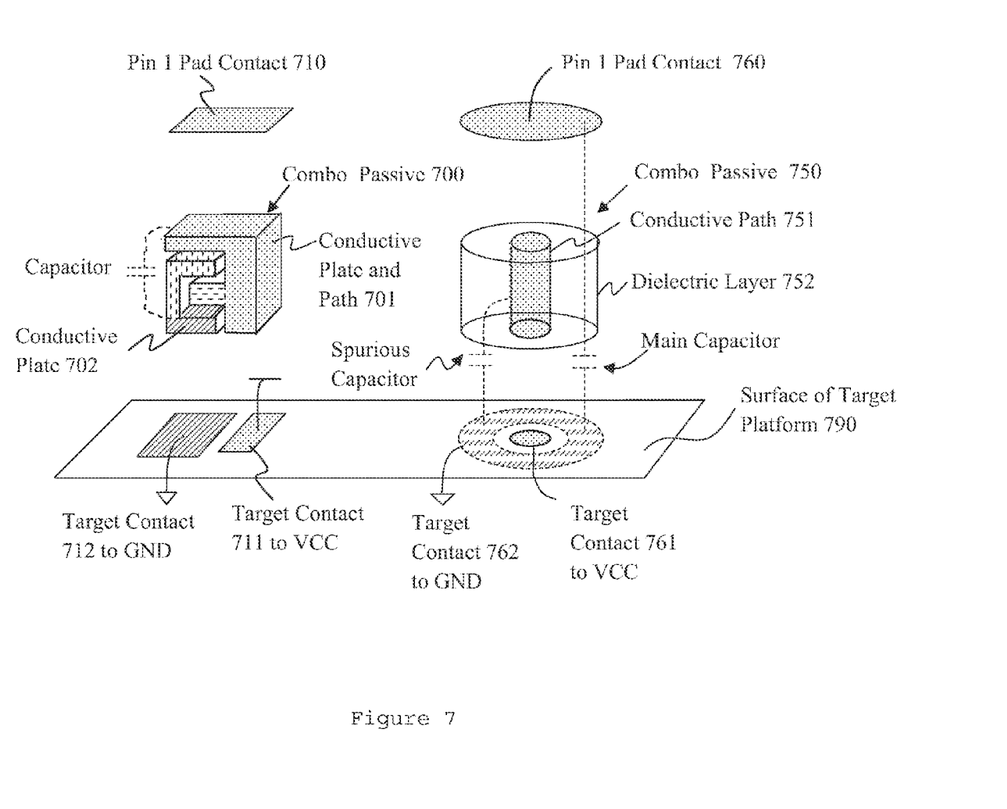
FIG. 7 shows cross-sectional views of example implementations of combinations of passive components implemented in a vertically-structured passive component according to embodiments of the present invention.

FIG. 7 shows two example implementations of connecting a decoupling capacitor to a power input pin of an integrated circuit ("IC") component using a vertical passive including a combination structure. The vertical passive including a combination structure 700 comprises a conductive plate and path 701 and a companion conductive plate 702. Depending upon the capacitance requirement, the conductive plates may be interlaced to increase the capacitance, as shown in vertical passive including a combination structure 700, where the conductive plate and path 701 has a reverse "F" shape and the conductive plate 702 has a "e" shape. Alternatively, if a smaller capacitance value is to be implemented, the conductive plate and path 701 may be a simpler inverse "L" shape and the conductive plate 702 may be a flat horizontal plate. Because the decoupling capacitor C1 shown in FIG. 6 has three connections, i.e. a connection to the VCC power Pin 1 of IC component, a connection to a power source and a connection to ground, three terminals are used to implement a vertical passive including a combination structure comprising a capacitor and a conduction path. Hence, split target contacts 711 and 712 are added to the surface of target platform 790. In an embodiment, the target contact 711 which is connected to a power source (VCC) on a target platform is in contact with the conductive plate and path 701 at vertical passive, through which making contact with the power input pin (pin 1 in FIG. 6) of the IC component, supplying the IC component with power. A capacitor is formed between the conductive plate and path 701 and the conductive plate 702, which is connected to ground through target contact 712 at the surface of target platform 790.

The vertical passive including a combination structure 750 comprises a thin conductive path 751 and a thick dielectric 752 surrounding the conductive path 751, which acts as an insulation layer. A capacitor is formed between the pad contact 760 of the IC component and the target contact 762 at the surface of target platform 790. This implicitly provides the ability to adjust the capacitance value of the vertical passive including a combination structure 751 by varying the area of the target contact 762 connected to ground. Alternatively, a donut shaped passive contact, similar to the target contact 762, may be fabricated at a first surface of the vertical passive including a combination structure 750 and a circular shaped passive contact, similar to the pad contact 760 may be fabricated at a second surface of the vertical passive including a combination structure 750. Power (VCC) is supplied to the IC component (e.g., supplied to pin 1 of IC component shown in FIG. 6) through the target contact 761, which is connected to a power supply (VCC) at the surface of the target platform 790, and through the conductive path 751, which makes electrical contact with the pad contact 760 of the IC component.

Figure 8:
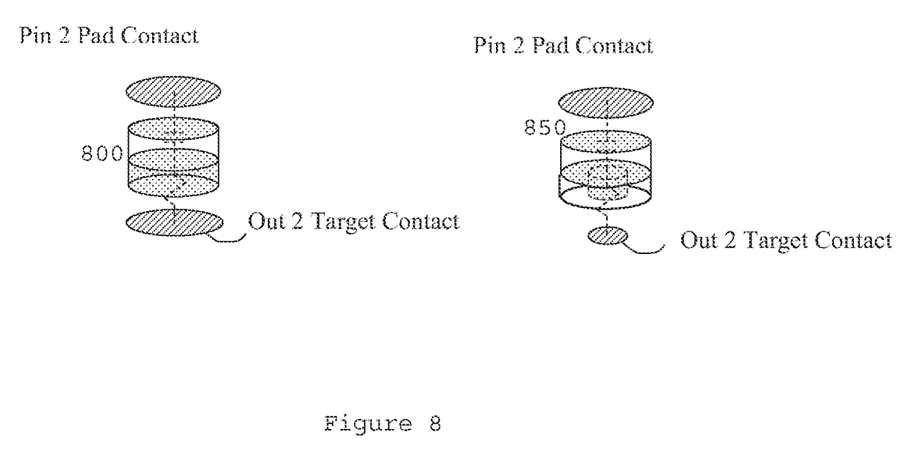
FIG. 8 shows example implementations of a series connection of a resistor and a capacitor using a vertically-structured passive component according to embodiments of the present invention.

FIG. 8 shows two example implementations of a capacitor and a resistor connected in series using a vertical passive including a combination structure 800, 850. The vertical passive including a combination structure shown in 800 or 850 comprises two passive components stacked along a first axis that is substantially perpendicular to the target platform, where the capacitor is at the top section of the combination structure connecting to pad contact of an IC component and the resistor is at the bottom section of the combination structure connecting to the target contact at the surface of target platform.

Figure 9:
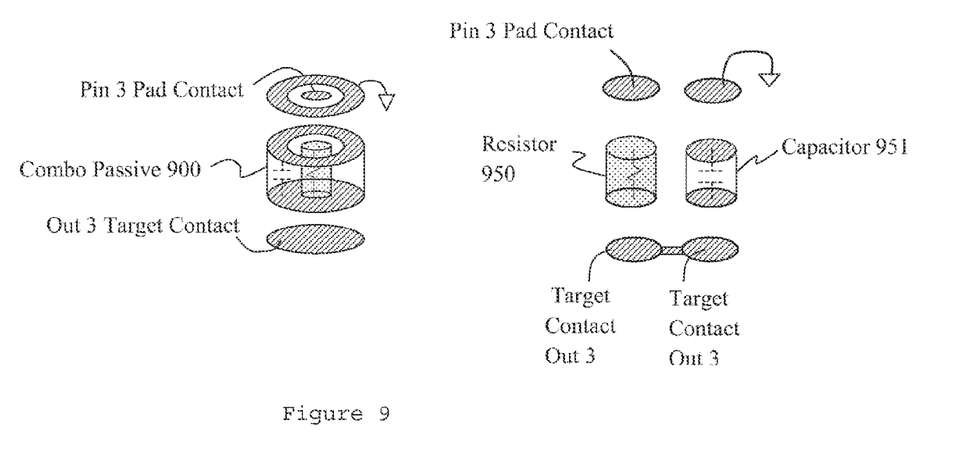
FIG. 9 shows example implementations of a low-pass filter using one or more vertically-structured passive components according to embodiments of the present invention.

FIG. 9 shows example implementations of a low-pass filter at an IC component pad contact comprising a resistor coupled to a capacitor ("RC low pass filter") using a vertical passive including a combination structure. A vertical passive including a combination structure 900 includes a donut shaped passive contact at a first surface for connecting to a grounded donut shaped pad contact at IC and a circular shaped passive contact at a second surface for contacting RC output through a target contact at the surface of target platform, plus a resistive core with a passive contact connecting to a pad contact of the IC component at the center of the donut shaped passive contact and connecting to the target contact at the surface of target platform. Alternatively, two vertical passives may be used to implement a RC low pass filter, where two sets of pads of the IC component and two sets of target contacts at the surface of target platform, which are connected together, are used. In another embodiment, components within the vertical passive are oriented so that they are connected along an axis that is substantially parallel to the target platform.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. An electronic device for electrical connection between a first pad contact of an integrated circuit component and a target contact positioned substantially in a first plane of a target platform, the electronic device comprising:
   a first surface substantially parallel to the first plane, the first surface including a first contact region configured to connect to the first pad contact when the electronic device is connected between the first pad contact and the target contact,
   wherein a size of the first surface is compatible with a size and a pitch of the first pad contact;
   a second surface opposite the first surface and substantially parallel to the first plane, the second surface including a second contact region configured to connect to the target contact when the electronic device is connected between the first pad contact and the target contact; and
   a plurality of electrically passive elements connected between the first and second contact regions.

2. The electronic device of claim 1, wherein a width of the first surface in a direction substantially in the first plane is configured in accordance with a portion of the shortest distance between a center of the first pad contact and a center of a nearby pad contact of the integrated circuit component.

3. The electronic device of claim 1, wherein a width of the second surface in a direction substantially in the first plane is configured in accordance with a portion of the shortest distance between a center of the target contact and a center of a nearby target contact of the target platform.

4. The electronic device of claim 1, wherein one of the first and second surfaces includes a third contact region.

5. The electronic device of claim 4, wherein the plurality of electrically passive elements are connected in parallel between the first, second, and third contact regions.

6. The electronic device of claim 5, wherein the plurality of electrically passive elements comprise at least one of:
   a resistor and a capacitor,
   a conduction path and a capacitor,
   a first capacitor and a second capacitor different from the first capacitor,
   an electro-optical device and a capacitor,
   a diode and a capacitor,
   an inductor and a capacitor, or
   a ferrite bead and a capacitor.

7. The electronic device of claim 1, wherein the plurality of electrically passive elements are connected in series between the first and second contact regions.

8. The electronic device of claim 7, wherein the plurality of electrically passive elements comprise a conduction path coupled to at least one of a resistor, a capacitor, an inductor or a diode device.

9. The electronic device of claim 7, wherein the plurality of electrically passive elements comprise a resistor coupled to at least one of a capacitor or an inductor.

10. The electronic device of claim 7, wherein the plurality of electrically passive elements comprise a capacitor coupled to an inductor.

11. The electronic device of claim 7, wherein the plurality of electrically passive elements comprise a resistor, a capacitor and a conduction path.

12. The electronic device of claim 7, wherein the plurality of electrically passive elements comprise a capacitor, an inductor and a conduction path.

13. The electronic device of claim 1, wherein the electronic device is constructed in a geometry selected from the group consisting of a circular cross-section, a triangular cross-section, a square cross-section, a rectangular cross-section, a rhomboidal cross-section, a hexagonal cross section, an octagonal cross-section, and a half-circle cross-section.

14. The electronic device of claim 1, wherein at least one of the first contact region and the second contact region include a layer of solder.

15. The electronic device of claim 1, wherein the first contact region has a cross-section having a first shape and the second contact region has a second cross-section having a second shape.

16. The electronic device of claim 15, wherein the first shape is different from the second shape.

17. The electronic device of claim 1, wherein an insulation sidewall is affixed to an exterior surface of the plurality of electrically passive elements, the insulation sidewall at least partially encircling at least one of the first contact region and the second contact region.

18. The electronic device of claim 17, wherein a thickness of the insulation sidewall in a direction substantially parallel to the first plane prevents an electrical short between the first pad contact and the target contact.

19. The electronic device of claim 17, wherein a thickness of the insulation sidewall in a direction substantially parallel to the first plane prevents an electrical short between the first and second contact regions.

20. The electronic device of claim 1, wherein the plurality of electrically passive elements are connected in a structure along an axis substantially perpendicular to the first plane.

21. The electronic device of claim 1, wherein the target platform is a printed circuit board.

22. The electronic device of claim 1, wherein the target platform is an electronic component.

23. A method for electrically connecting an electronic device between a first pad contact of an integrated circuit component and a target contact positioned substantially in a first plane of a target platform, the method comprising:
providing a first surface substantially parallel to the first plane;
providing a first contact region at the first surface, wherein a size of the first surface is compatible with a size and a pitch of the first pad contact;
configuring the first contact region to connect to the first pad contact when connecting the electronic device between the first pad contact and the target contact;
providing a second surface opposite the first surface and substantially parallel to the first plane;
providing a second contact region at the second surface;
configuring the second contact region to connect to the target contact when the electronic device is connected between the first pad contact and the target contact; and
connecting a plurality of electrically passive elements between the first and second contact regions.

24. The method of claim 23, wherein a width of the first surface in a direction substantially in the first plane is configured in accordance with a portion of the shortest distance between a center of the first pad contact and a center of a nearby pad contact of the integrated circuit component.

25. The method of claim 23, wherein a width of the second surface in a direction substantially in the first plane is configured in accordance with a portion of the shortest distance between a center of the target contact and a center of a nearby target contact of the target platform.

26. The method of claim 23, wherein one of the first and second surfaces includes a third contact region.

27. The method of claim 26, wherein the plurality of electrically passive elements are connected in parallel between the first, second, and third contact regions.

28. The method of claim 27, wherein the plurality of electrically passive elements comprise at least one of:
a resistor and a capacitor,
a conduction path and a capacitor,
a first capacitor and a second capacitor different from the first capacitor,
an electro-optical device and a capacitor,
a diode and a capacitor,
an inductor and a capacitor, or
a ferrite bead and a capacitor.

29. The method of claim 23, wherein the plurality of electrically passive elements are connected in series between the first and second contact regions.

30. The method of claim 29, wherein the plurality of electrically passive elements comprise a conduction path coupled to at least one of a resistor, a capacitor, an inductor or a diode device.

31. The method of claim 29, wherein the plurality of electrically passive elements comprise a resistor coupled to at least one of a capacitor or an inductor.

32. The method of claim 29, wherein the plurality of electrically passive elements comprise a capacitor coupled to an inductor.

33. The method of claim 29, wherein the plurality of electrically passive elements comprise a resistor, a capacitor and a conduction path.

34. The method of claim 29, wherein the plurality of electrically passive elements comprise a capacitor, an inductor and a conduction path.

35. The method of claim 23, wherein the electronic device is constructed in a geometry selected from the group consisting of a circular cross-section, a triangular cross-section, a square cross-section, a rectangular cross-section, a rhomboidal cross-section, a hexagonal cross section, an octagonal cross-section, and a half-circle cross-section.

36. The method of claim 23, wherein at least one of the first contact region and the second contact region include a layer of solder.

37. The method of claim 23, wherein the first contact region has a cross-section having a first shape and the second contact region has a second cross-section having a second shape.

38. The method of claim 37, wherein the first shape is different from the second shape.

39. The method of claim 23, wherein an insulation sidewall is affixed to an exterior surface of the plurality of electrically passive elements, the insulation sidewall at least partially encircling at least one of the first contact region and the second contact region.

40. The method of claim 39, wherein a thickness of the insulation sidewall in a direction substantially parallel to the first plane prevents an electrical short between the first pad contact and the target contact.

41. The method of claim 39, wherein a thickness of the insulation sidewall in a direction substantially parallel to the first plane prevents an electrical short between the first and second contact regions.

42. The method of claim 23, wherein the plurality of electrically passive elements are connected in a structure along an axis substantially perpendicular to the first plane.

43. The method of claim 23, wherein the target platform is a printed circuit board.

44. The method of claim 23, wherein the target platform is an electronic component.

* * * * *